United States Patent
Nakata et al.

(10) Patent No.: US 8,866,205 B2
(45) Date of Patent: Oct. 21, 2014

(54) PHOTOELECTRIC CONVERSION DEVICE AND IMAGE SENSING

(75) Inventors: Yasushi Nakata, Yokohama (JP);
Shigeru Nishimura, Ebina (JP);
Ryuichi Mishima, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 1473 days.

(21) Appl. No.: 11/844,545

(22) Filed: Aug. 24, 2007

(65) Prior Publication Data

US 2008/0054388 A1 Mar. 6, 2008

(30) Foreign Application Priority Data

Aug. 31, 2006 (JP) .................................. 2006-236762

(51) Int. Cl.
*H01L 31/062* (2012.01)
*H01L 27/146* (2006.01)

(52) U.S. Cl.
CPC ..... *H01L 27/14632* (2013.01); *H01L 27/14621* (2013.01); *H01L 27/14636* (2013.01); *H01L 27/14627* (2013.01)
USPC ..... 257/294; 257/432; 257/435; 257/E31.122

(58) Field of Classification Search
CPC ................... H01L 27/14627; H01L 27/14632; H01L 27/14636
USPC .......................................... 257/294, E31.122
See application file for complete search history.

(56) References Cited

U.S. PATENT DOCUMENTS

| | | | |
|---|---|---|---|
| 6,030,852 A * | 2/2000 | Sano et al. ...................... | 438/69 |
| 6,169,317 B1 | 1/2001 | Sawada et al. ................ | 257/435 |
| 2005/0184362 A1 | 8/2005 | Fujita ............................. | 257/620 |
| 2006/0038209 A1 * | 2/2006 | Hashimoto .................... | 257/294 |
| 2006/0043442 A1 | 3/2006 | Yuzurihara et al. ........... | 257/292 |
| 2006/0163628 A1 * | 7/2006 | Mori et al. ..................... | 257/291 |
| 2006/0170069 A1 * | 8/2006 | Kim ............................... | 257/432 |
| 2007/0001252 A1 * | 1/2007 | Noda et al. .................... | 257/432 |
| 2007/0205439 A1 | 9/2007 | Okita et al. .................... | 257/228 |

FOREIGN PATENT DOCUMENTS

| | | |
|---|---|---|
| JP | 2-073651 A | 3/1990 |
| JP | 3-038041 A | 2/1991 |
| JP | 8-306902 A | 11/1996 |
| JP | 2000252452 A | 9/2000 |
| JP | 2004-186407 A | 7/2004 |
| JP | 2005275664 A | 10/2005 |
| JP | 2005-317932 A | 11/2005 |
| JP | 2006-073886 A | 3/2006 |

* cited by examiner

*Primary Examiner* — Hsin-Yi Hsieh
(74) *Attorney, Agent, or Firm* — Fitzpatrick, Cella, Harper & Scinto (57) ABSTRACT

A photoelectric conversion device is disclosed. The photoelectric conversion device includes a semiconductor substrate having a plurality of photoelectric converters, a multilayer wiring structure arranged on the semiconductor substrate, and a planarized layer arranged on the multilayer wiring structure. The multilayer wiring structure includes a first wiring layer, an interlayer insulation film arranged to cover the first wiring layer, and a second wiring layer serving as a top wiring layer arranged on the interlayer insulation film. The planarized layer covers the interlayer insulation film and the second wiring layer. The second wiring layer is thinner than the first wiring layer.

15 Claims, 12 Drawing Sheets

PRIOR ART

F I G. 12

PHOTOELECTRIC CONVERSION DEVICE AND IMAGE SENSING

BACKGROUND OF THE INVENTION

1. Field of the Invention

The present invention relates to a photoelectric conversion device and image sensing system.

2. Description of the Related Art

Recently, as described in Japanese Patent Laid-Open No. 2004-186407, photoelectric conversion devices are achieving higher pixel densities and smaller chip sizes, and the area of the photoelectric converter (e.g., photodiode) is tending to decrease. Japanese Patent Laid-Open No. 2000-252452 discloses a photoelectric conversion device having a plurality of wiring layers.

Figure 12:
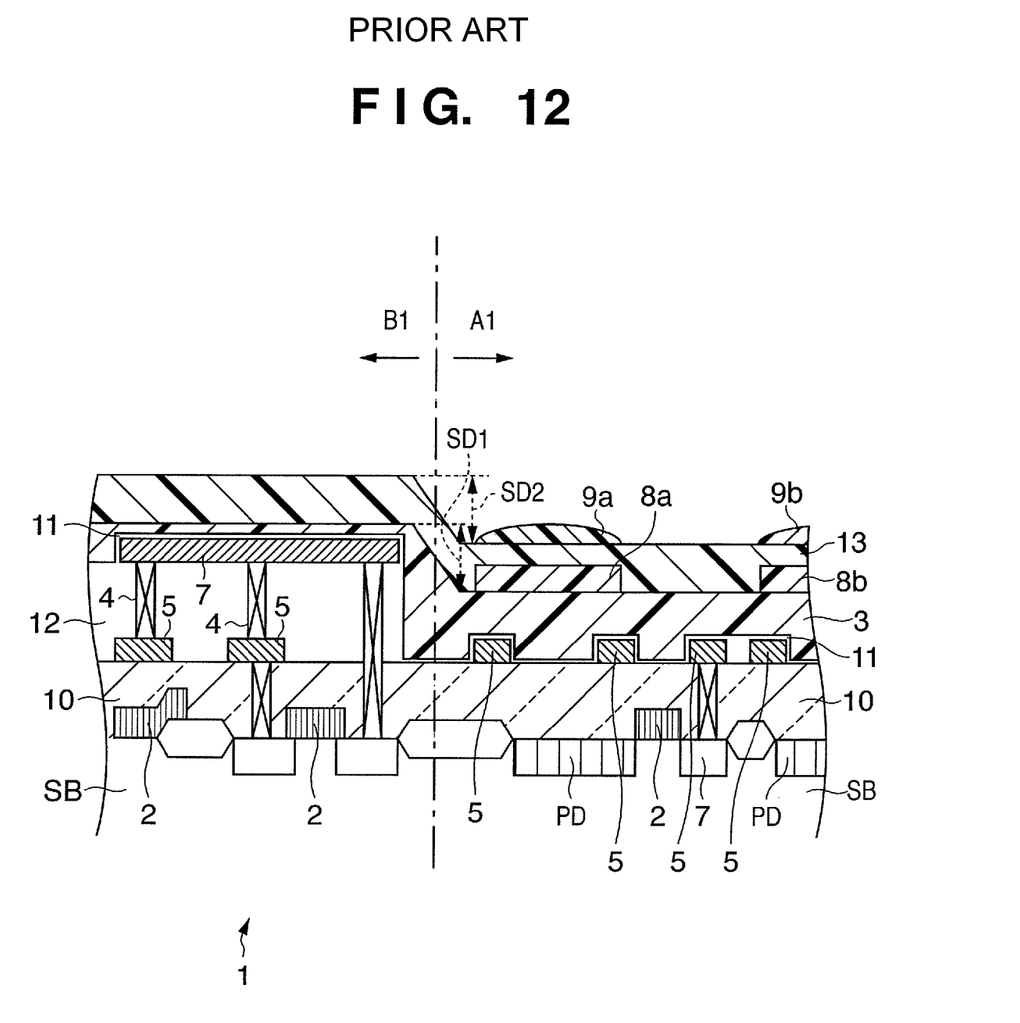
FIG. 12 is a sectional view for explaining a problem to be solved by the present invention.

As shown in FIG. 12, a photoelectric conversion device disclosed in Japanese Patent Laid-Open No. 2004-186407 has a pixel area A1 where photoelectric converters PD are arranged, and a peripheral circuit area B1 serving as the peripheral area of the pixel area A1. The peripheral circuit area B1 is shielded from light. In the pixel area A1, one metal layer 5 and one polysilicon layer 2, in other words, a total of two wiring layers are arranged. In the peripheral circuit area B1, two metal layers 5, 7 and one polysilicon layer 2, in other words, a total of three wiring layers are arranged. Since the numbers of wiring layers in the pixel area A1 and peripheral circuit area B1 are different from each other, it is difficult to satisfactorily planarize the entire top faces of planarized layers 3 and 13 arranged on a passivation film 11. In this case, the planarized layers 3 and 13 must be made thick. Steps SD1 and SD2 sometimes appear on the top faces of the planarized layers 3 and 13. This makes it difficult to apply the materials of color filters 8a and 8b and microlenses 9a and 9b to uniform thicknesses. As a result, the thicknesses of the color filters 8a and 8b and microlenses 9a and 9b may vary.

SUMMARY OF THE INVENTION

It is an object of the present invention to provide a photoelectric conversion device and image sensing system capable of easily planarizing the entire top face of a planarized layer.

A photoelectric conversion device according to the first aspect of the present invention comprises a semiconductor substrate having a plurality of photoelectric converters, a multilayer wiring structure arranged on the semiconductor substrate, and a planarized layer arranged on the multilayer wiring structure, wherein the multilayer wiring structure includes a first wiring layer, an interlayer insulation film arranged to cover the first wiring layer, and a second wiring layer serving as a top wiring layer arranged on the interlayer insulation film, the planarized layer covers the interlayer insulation film and the second wiring layer, and the second wiring layer is thinner than the first wiring layer.

A photoelectric conversion device according to the second aspect of the present invention comprises a pixel area where light enters a photoelectric converter, and a peripheral circuit area where the photoelectric converter is shielded from light, wherein a top wiring layer among a plurality of wiring layers arranged in the peripheral circuit area is arranged at a level higher than a top wiring layer among a plurality of wiring layers arranged in the pixel area, a planarized layer is arranged to cover at least the top wiring layer in the peripheral circuit area, and the top wiring layer in the peripheral circuit area is thinner than the top wiring layer in the pixel area.

An image sensing system according to the third aspect of the present invention comprises the above-described photoelectric conversion device, an optical system which forms an optical image of an object on the photoelectric conversion device, and a signal processing unit which processes a signal output from the photoelectric conversion device to generate image data.

The present invention can easily planarize the entire top face of a planarized layer.

Further features of the present invention will become apparent from the following description of exemplary embodiments with reference to the attached drawings.

DESCRIPTION OF THE EMBODIMENTS

In the description of the positional relationship between layers in this specification, "on" may apply to an immediately upper layer or an upper layer via one or more layers. Similarly, "below" may apply to an immediately lower layer or a lower layer via one or more layers.

A photoelectric conversion device according to the first embodiment of the present invention will be described with reference to FIGS. 1 to 6.

Figure 1:
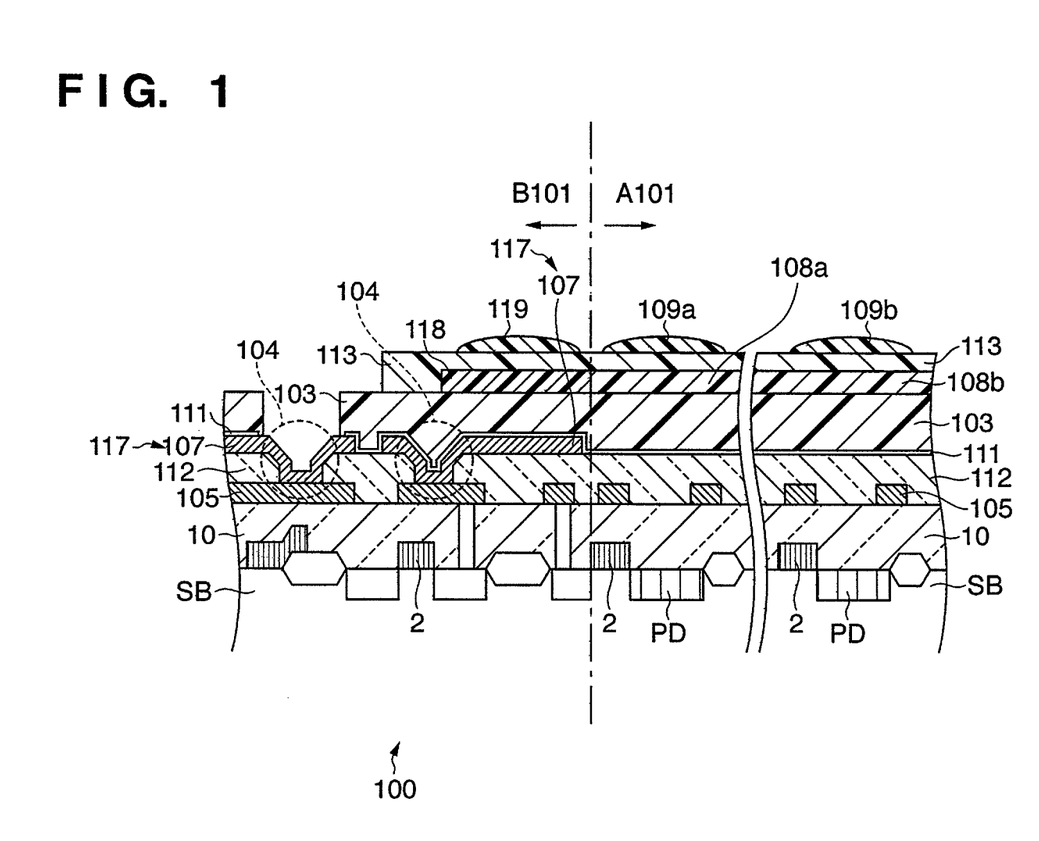
FIG. 1 is a sectional view of a photoelectric conversion device according to the first embodiment of the present invention.
Figure 2:
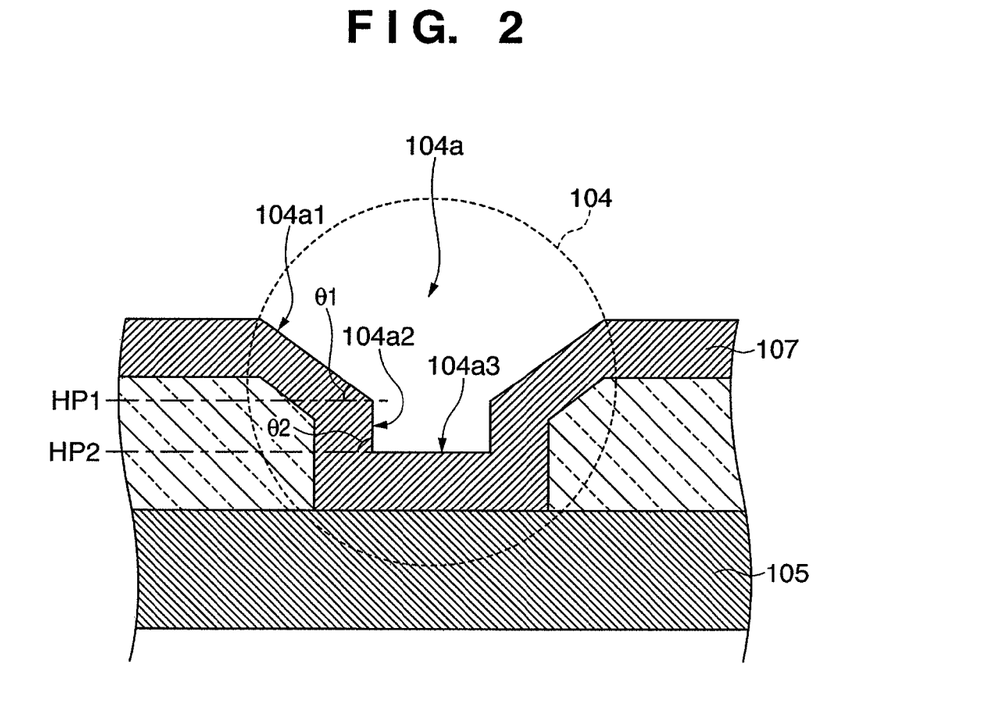
FIG. 2 is an enlarged sectional view of the vicinity of the second pattern in the photoelectric conversion device according to the first embodiment of the present invention.

The arrangement of the photoelectric conversion device according to the first embodiment will be explained with reference to FIGS. 1 and 2. FIG. 1 is a sectional view of the photoelectric conversion device according to the first embodiment of the present invention. FIG. 2 is an enlarged sectional view of the vicinity of the second pattern in the photoelectric conversion device according to the first embodiment of the present invention.

A photoelectric conversion device 100 has a pixel area A101 and peripheral circuit area B101. In the pixel area A101, photodiodes (photoelectric converters) PD are arranged. The peripheral circuit area B101 arranged at the periphery of the pixel area A101 is shielded from light. The photodiodes PD are formed in a semiconductor substrate SB.

In the pixel area A101, the photodiodes (photoelectric converters) PD, polysilicon layers 2, metal layers (first wiring layers) 105, color filters 108a and 108b, and microlenses 109a and 109b are arranged. In the pixel area A101, interlayer insulation films 10 and 112, a passivation film 111, and planarized layers 103 and 113 are also arranged. In the pixel area A101, no metal layer (second wiring layer) 117 is arranged.

Note that part of the metal layer 117 may also be arranged in the pixel area A101.

In the peripheral circuit area B101, polysilicon layers 2, metal layers (first wiring layers) 105, metal layers (second wiring layers) 117, a color filter 118, and a microlens 119 are arranged. In the pixel area A101, interlayer insulation films 10 and 112, a passivation film 111, and planarized layers 103 and 113 are also arranged. Each metal layer 117 has a first pattern 107 and second pattern 104. The first pattern 107 is arranged on the interlayer insulation film 112 in the peripheral circuit area B101. The second pattern 104 places the metal layer 105 and first pattern 107 in contact with each other. The first and second patterns are arranged from the same metal film, and the first pattern 107 functions not only as a wiring layer but also as a light-shielding film. Forming the first pattern 107 and second pattern 104 from the same metal film can reduce the number of processes, compared to a method of separately forming a via hole and wiring layer.

The peripheral circuit area B101 also includes an optical black area (OB area). In FIG. 1, no photodiode exists in the peripheral circuit area B101, but photodiodes with an arrangement similar to that in the pixel area A101 may also be arranged. The light-shielding film (metal layers 117) shields, from light, photodiodes arranged in the peripheral circuit area B101. Thus, a signal photoelectrically converted by this photodiode is used as a reference signal to be compared with a signal in the pixel area A101. As is well known, the peripheral circuit area can further include a driving circuit to read out a signal from a pixel, and a signal processing circuit to process a readout signal.

Since no metal layer 117 is arranged in the pixel area A101, the numbers of wiring layers in the pixel area A101 and peripheral circuit area B101 are different from each other. This may generate steps on the top faces of the planarized layers 103 and 113.

To prevent this, the present invention can make the top face of the interlayer insulation film 112 at the same level in the pixel area A101 and peripheral circuit area B101. The metal layer 117 is thinner than the metal layer 105. Although the light-shielding film is desirably thick enough to shut out light, the metal layer 117 is, for example, 200 nm to 300 nm thick and the metal layer 105 is, for example, 400 nm to 800 nm thick. These settings reduce the step on the top face of the passivation film 111 below the planarized layers 103 and 113, so the top faces of the planarized layers 103 and 113 can also be easily planarized. Hence, the materials of the color filters 108a and 108b and microlenses 109a and 109b can be easily applied to uniform thicknesses. This can reduce variations in the thicknesses of the color filters 108a and 108b arranged on the planarized layer 103 and those of the microlenses 109a and 109b arranged on the planarized layer 113. As a result, variations between pixels in the light collection efficiency to the photoelectric converter PD can be suppressed, preventing degradation in the characteristics of the photoelectric conversion device 100.

The metal layer 117 is thinner than the metal layer 105. Thus, when the first pattern 107 and metal layer 105 are so arranged as to be connected through a via hole (see a via hole 4 in FIG. 12), the coatability of a conductive substance to the side wall of the via hole may suffer.

Figure 5:
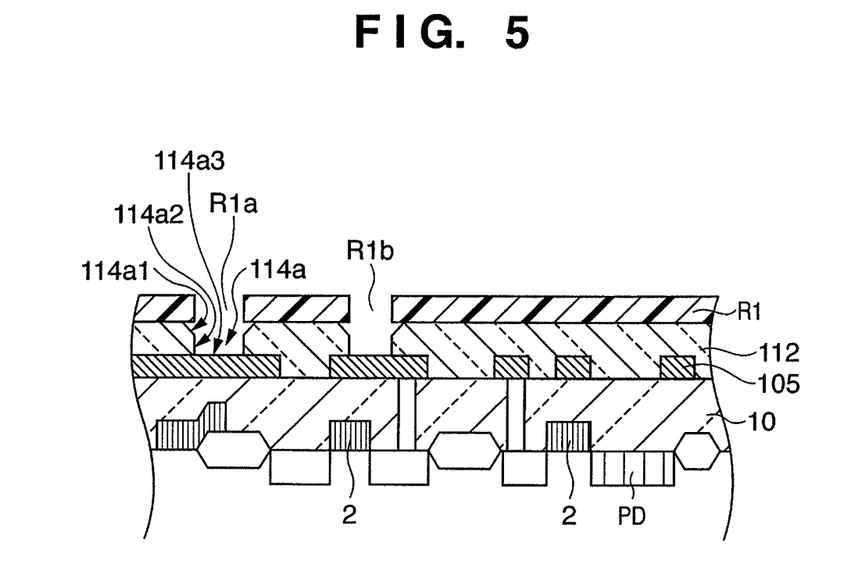
FIG. 5 is a sectional view showing a step of the photoelectric conversion device manufacturing method.

To prevent this, according to the present embodiment, an opening 114a including a first side face of opening 114a1, second side face of opening 114a2, and bottom face 114a3 is arranged as shown in FIG. 5. The second side face of opening 114a2 extends from the first side face of opening 114a1 in the depth direction of the opening 114a. The taper angle (≈θ1) of the first side face of opening 114a1 is smaller than the taper angle (≈θ2) of the second side face of opening 114a2 (see FIG. 2). The opening 114a has a tapered shape to decrease the opening width from the first pattern 107 toward the underlying wiring layer (metal layer 105). This can suppress degradation of the coatability of a conductive substance to the first side face of opening 114a1 and second side face of opening 114a2. The metal layer 105, first pattern 107, and second pattern 104 can ensure a good electrical connection.

The metal layers 105 and 117 are connected to each other via the second pattern 104 containing a conductive substance in the opening 114a. As shown in FIG. 2, the second pattern 104 is shaped (tapered) along the opening 114a. That is, the second pattern 104 has a recess 104a. The side face of the recess 104a includes a first side face (upper portion) 104a1 and second side face 104a2. The first side face 104a1 extends from the top face of the first pattern 107. The second side face 104a2 extends from the first side face 104a1 in the depth direction of the recess 104a. The first side face 104a1 is inclined to the surface of the semiconductor substrate SB. The first side face 104a1 is tapered toward the bottom face 104a3 of the recess 104a. A taper angle θ1 (angle made with a horizontal plane HP1) of the first side face 104a1 is smaller than a taper angle θ2 (angle made with a horizontal plane HP2) of the second side face 104a2. The shape (tapered shape) suitable for forming the second pattern 104 with good coatability can ensure a good electrical connection between the metal layer 105, the first pattern 107, and the second pattern 104.

A method of manufacturing the photoelectric conversion device according to the first embodiment will be explained with reference to FIGS. 3 to 6. FIGS. 3 to 6 are sectional views showing the steps of the photoelectric conversion device manufacturing method. In FIGS. 3 to 6, layers below the metal layer 105 do not have any characteristic arrangement as compared with the photoelectric conversion device 1 (see FIG. 12), and a description and illustration of the manufacturing method of these layers will be omitted.

Figure 3:
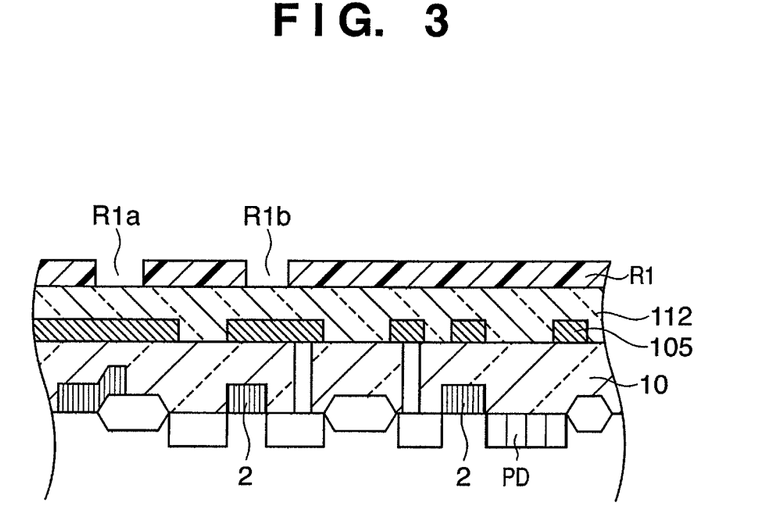
FIG. 3 is a sectional view showing a step of a photoelectric conversion device manufacturing method.

In a step shown in FIG. 3, after a metal layer 105 is formed, an interlayer insulation film 112 is formed on the metal layer 105. The top face of the interlayer insulation film 112 is planarized by CMP or the like. A resist R1 is applied to the entire surface of the interlayer insulation film 112 and shaped into opening patterns R1a and R1b of the resist R1 by lithography.

Figure 4:
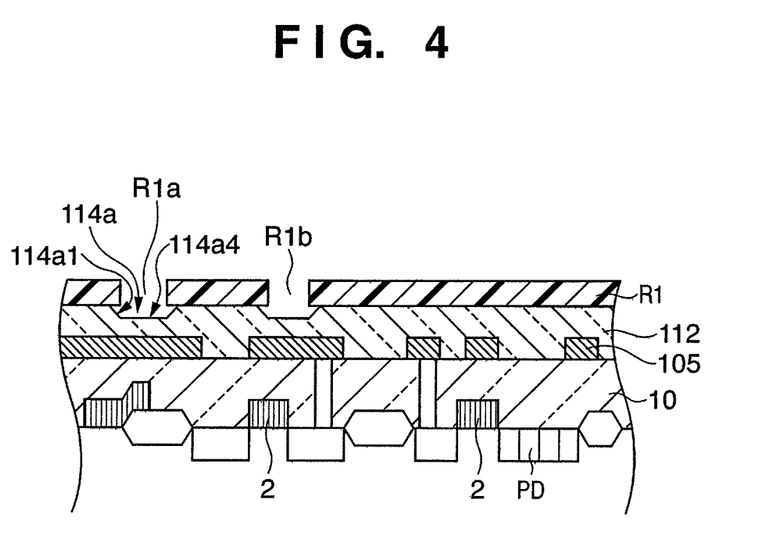
FIG. 4 is a sectional view showing a step of the photoelectric conversion device manufacturing method.

In a step shown in FIG. 4, the interlayer insulation film 112 is isotropically etched by wet etching or the like using the opening patterns R1a and Rib of the resist R1 as a mask. As a result, a temporary opening 114a including a first side face of opening 114a1 and temporary bottom face 114a4 is formed in the interlayer insulation film 112. The first side face of opening 114a1 extends from the top face of the interlayer insulation film 112, and is inclined to the surface of the semiconductor substrate SB. The first side face of opening 114a1 is tapered toward the bottom face 114a4.

In a step shown in FIG. 5, the interlayer insulation film 112 is anisotropically etched by dry etching or the like using the opening patterns R1a and R1b of the resist R1 as a mask. As a result, the opening 114a including a second side face of opening 114a2 and bottom face 114a3 is obtained. The second side face of opening 114a2 extends from the first side face of opening 114a1 in the depth direction of the opening 114a. The taper angle (≈θ1) of the first side face of opening 114a1 is smaller than the taper angle (≈θ2) of the second side face of opening 114a2 (see FIG. 2). This method makes it possible to form an opening including a plurality of areas with different taper angles by changing only the etching conditions of the interlayer insulation film using the same resist patterns R1a and R1b. This can reduce the number of steps and simplify the manufacturing process.

In the next step, the resist R1 is removed from the interlayer insulation film 112, and a metal film is formed on the entire surface. A resist is applied again to the entire surface of the metal film, and shaped into opening patterns of the resist by lithography. A metal layer 117 is formed using the opening patterns of the resist as a mask. That is, a first pattern 107 and second pattern 104 are formed simultaneously. This can reduce the number of processes of forming the second pattern 104, as compared with a planarization step of burying a barrier metal and plug in a via hole.

As described above, the first side face of opening 114a1 of the opening 114a (see FIG. 5) is downwardly tapered toward the bottom face 114a4. This shape can suppress degradation of the coatability of a conductive substance to the first side face of opening 114a1 and second side face of opening 114a2. The metal layer 105, first pattern 107, and second pattern 104 can ensure a good electrical connection.

In the next step, the resist is removed from the interlayer insulation film 112. A passivation film is formed on the entire top faces of the metal layer 117 and interlayer insulation film 112. A resist is applied again to the entire surface of the passivation film, and formed into an island-shaped pattern by lithography. A passivation film 111 is formed using the island-shaped pattern of the resist as a mask.

Figure 6:
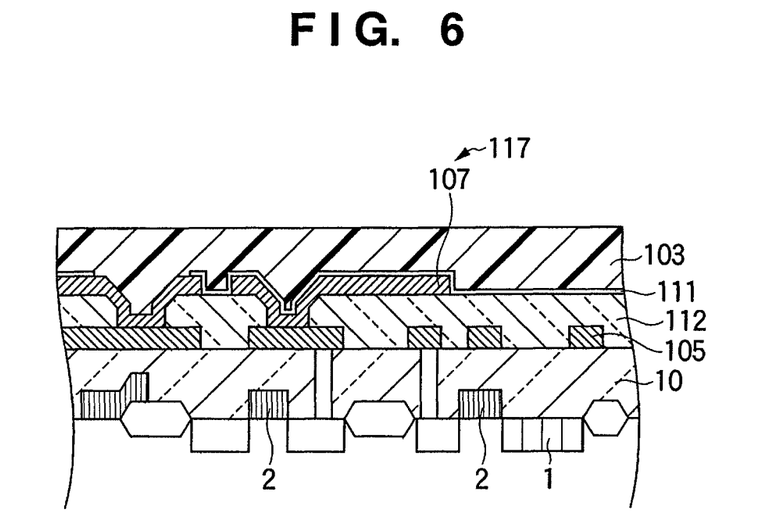
FIG. 6 is a sectional view showing a step of the photoelectric conversion device manufacturing method.

In the step shown in FIG. 6, a planarized layer 103 is formed on the metal layer 117 and passivation film 111. The planarized layer 103 is formed, for example, from the same resin as the resist. The top face of the planarized layer 103 is planarized by CMP or the like.

Since the step between the top faces of the first pattern 107 and passivation film 111 is small, the step on the top face of the formed planarized layer 103 is also small. Hence, the entire top face of the planarized layer 103 can be satisfactorily planarized. The necessary thickness of the planarized layer 103 can be made thin, and the distance from a photodiode to the top face of the planarized layer 103 can be shortened.

Then, as shown in FIG. 1, the material (e.g., the same organic material as the resist) of color filters 108a and 108b is applied to the entire surface of the planarized layer 103. Since the top face of the planarized layer 103 is flat, the thickness of the applied material becomes uniform. The applied material is patterned into color filters 108a and 108b by lithography or the like. This can reduce variations in the thicknesses of the color filters 108a and 108b.

A planarized layer 113 is formed on the color filters 108a and 108b. The planarized layer 113 is formed, for example from the same resin as the resist. The entire top face of the planarized layer 113 is planarized by CMP or the like.

Since the step on the top face of the planarized layer 103 is small, the step on the top face of the formed planarized layer 113 is also small. Thus, the entire top face of the planarized layer 113 can be satisfactorily planarized. The necessary thickness of the planarized layer 113 can also be made thin.

Subsequently, the material (e.g., the same organic material as the resist) of microlenses 109a and 109b is applied to the entire surface of the planarized layer 113. Since the top face of the planarized layer 113 is flat, the thickness of the applied material becomes uniform. The applied material is patterned into microlenses 109a and 109b by lithography or the like. This can reduce variations in the thicknesses of the microlenses 109a and 109b.

The taper angle of the second side face of opening 114a2 shown in FIG. 5 is not limited to almost 90°. The taper angle of the second side face 104a2 shown in FIG. 1 is not limited to almost 90°.

Figure 7:
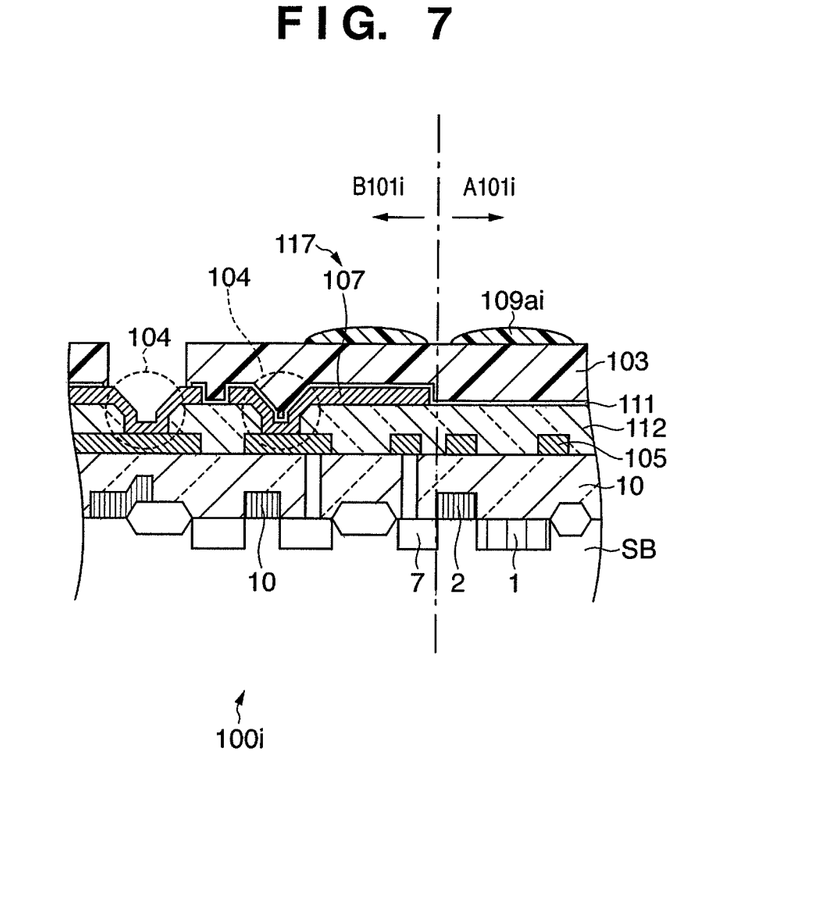
FIG. 7 is a sectional view of a photoelectric conversion device according to a modification to the first embodiment of the present invention.

In a photoelectric conversion device 100i shown in FIG. 7, neither the color filters 108a nor 108b need always be arranged in a pixel area A101i. Even in this case, a color image can be attained by performing a process to convert the gray level of a monochrome image into that of a color image using an image signal processor 97 (to be described later) or the like.

Figure 8:
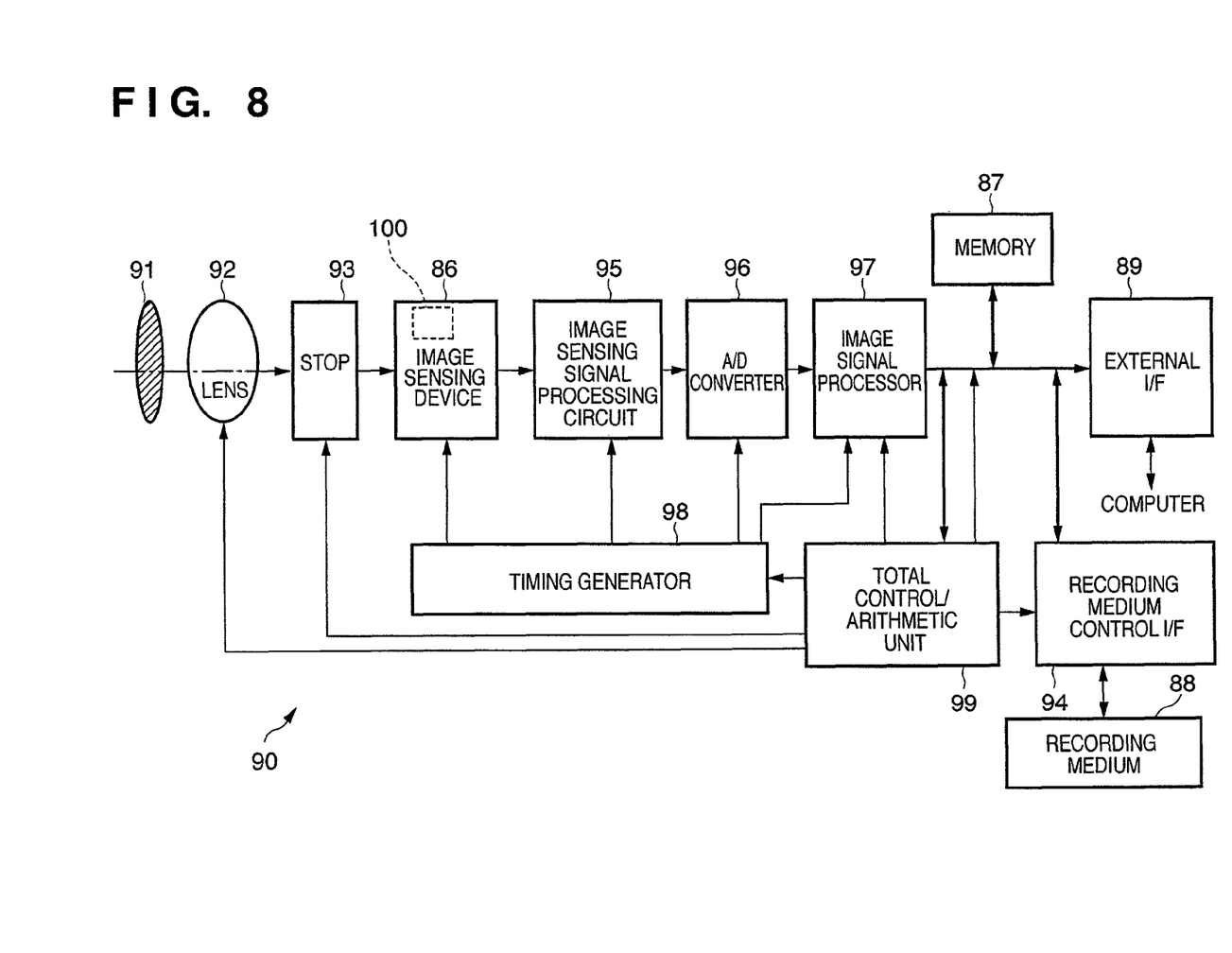
FIG. 8 is a block diagram of an example of an image sensing system to which the photoelectric conversion device according to the first embodiment is applied.

An example of an image sensing system to which the photoelectric conversion device according to the first embodiment is applied will be described next with reference to FIG. 8. FIG. 8 is a block diagram of the image sensing system to which the photoelectric conversion device according to the first embodiment is applied.

As shown in FIG. 8, an image sensing system 90 mainly includes an optical system, image sensing device 86, and signal processing unit. The optical system mainly includes a shutter 91, photographing lens 92, and stop 93. The image sensing device 86 includes the photoelectric conversion device 100. The signal processing unit manly includes an image sensing signal processing circuit 95, A/D converter 96, image signal processor 97, memory 87, external I/F 89, timing generator 98, total control/arithmetic unit 99, recording medium 88, and recording medium control I/F 94. Note that the signal processing unit need not comprise the recording medium 88.

The shutter 91 is arranged in front of the photographing lens 92 in the optical path, and controls exposure.

The photographing lens 92 refracts incident light, and forms an object image on the photoelectric conversion device 100 of the image sensing device 86.

The stop 93 is interposed between the photographing lens 92 and the photoelectric conversion device 100 in the optical path, and adjusts the quantity of light guided to the photoelectric conversion device 100 after passing through the photographing lens 92.

The photoelectric conversion device 100 of the image sensing device 86 converts, into an image signal, an object image formed on the photoelectric conversion device 100. The image sensing device 86 reads out and outputs the image signal from the photoelectric conversion device 100.

The image sensing signal processing circuit 95 is connected to the image sensing device 86, and processes an image signal output from it.

The A/D converter 96 is connected to the image sensing signal processing circuit 95, and converts, into a digital signal, a processed image signal (analog signal) output from the image sensing signal processing circuit 95.

The image signal processor 97 is connected to the A/D converter 96, and generates image data by performing arithmetic operations such as various correction processes for the image signal (digital signal) output from the A/D converter 96. The image signal processor 97 supplies the image data to the memory 87, external I/F 89, total control/arithmetic unit 99, recording medium control I/F 94, and the like.

The memory 87 is connected to the image signal processor 97, and stores image data output from the image signal processor 97.

The external I/F 89 is connected to the image signal processor 97. The external I/F 89 transfers image data output from the image signal processor 97 to an external device (e.g., personal computer).

The timing generator 98 is connected to the image sensing device 86, image sensing signal processing circuit 95, A/D converter 96, and image signal processor 97. The timing generator 98 supplies timing signals to the image sensing device 86, image sensing signal processing circuit 95, A/D converter 96, and image signal processor 97. The image sensing device 86, image sensing signal processing circuit 95, A/D converter 96, and image signal processor 97 operate in synchronism with the timing signals.

The total control/arithmetic unit 99 is connected to the timing generator 98, image signal processor 97, and recording medium control I/F 94, and controls all the timing generator 98, image signal processor 97, and recording medium control I/F 94.

The recording medium 88 is connected to the recording medium control I/F 94 so as to be removable from it. Image data output from the image signal processor 97 is recorded on the recording medium 88 via the recording medium control I/F 94.

As long as the photoelectric conversion device 100 with the above-described arrangement can provide a high-quality image signal, the user can obtain a high-quality image (image data).

Figure 9:
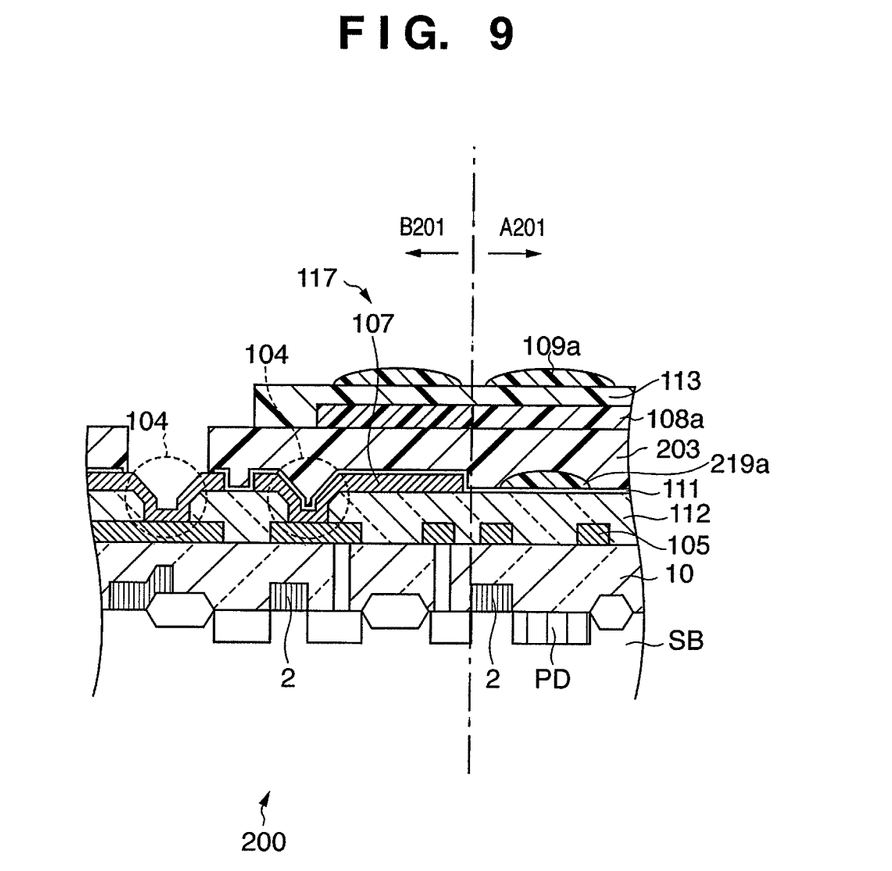
FIG. 9 is a sectional view of a photoelectric conversion device according to the second embodiment of the present invention.

A photoelectric conversion device according to the second embodiment of the present invention will be described next with reference to FIG. 9. FIG. 9 is a sectional view of the photoelectric conversion device according to the second embodiment of the present invention. In the second embodiment, mainly points that differ from the first embodiment will be described, and a description of the same parts will be omitted.

A photoelectric conversion device 200 has the same basic arrangement as that in the first embodiment, but is different from that in the first embodiment in the presence of a planarized layer 203 and interlayer lens 219a.

The interlayer lens 219a exists, for example, in the planarized layer 203 between a microlens 109a and a photodiode PD (see FIG. 1). The interlayer lens 219a is preferably formed from a substance having a refractive index different from those of the planarized layer 203 and a passivation film 111.

The interlayer lens 219a is arranged in an area where no metal layer 117 is arranged in the planarized layer 203. The top faces of the passivation film 111 (especially on metal layer 117) and interlayer lens 219a can be made at almost the same level. This can further suppress a step formed on the top face of the planarized layer 203.

By interposing the interlayer lens 219a between the microlens 109a and the photodiode PD, light guided to the photodiode PD can be refracted at a large angle. The light collection efficiency to the photodiode PD can be easily ensured, and thus higher pixel densities and smaller chip sizes can be obtained.

Figure 10:
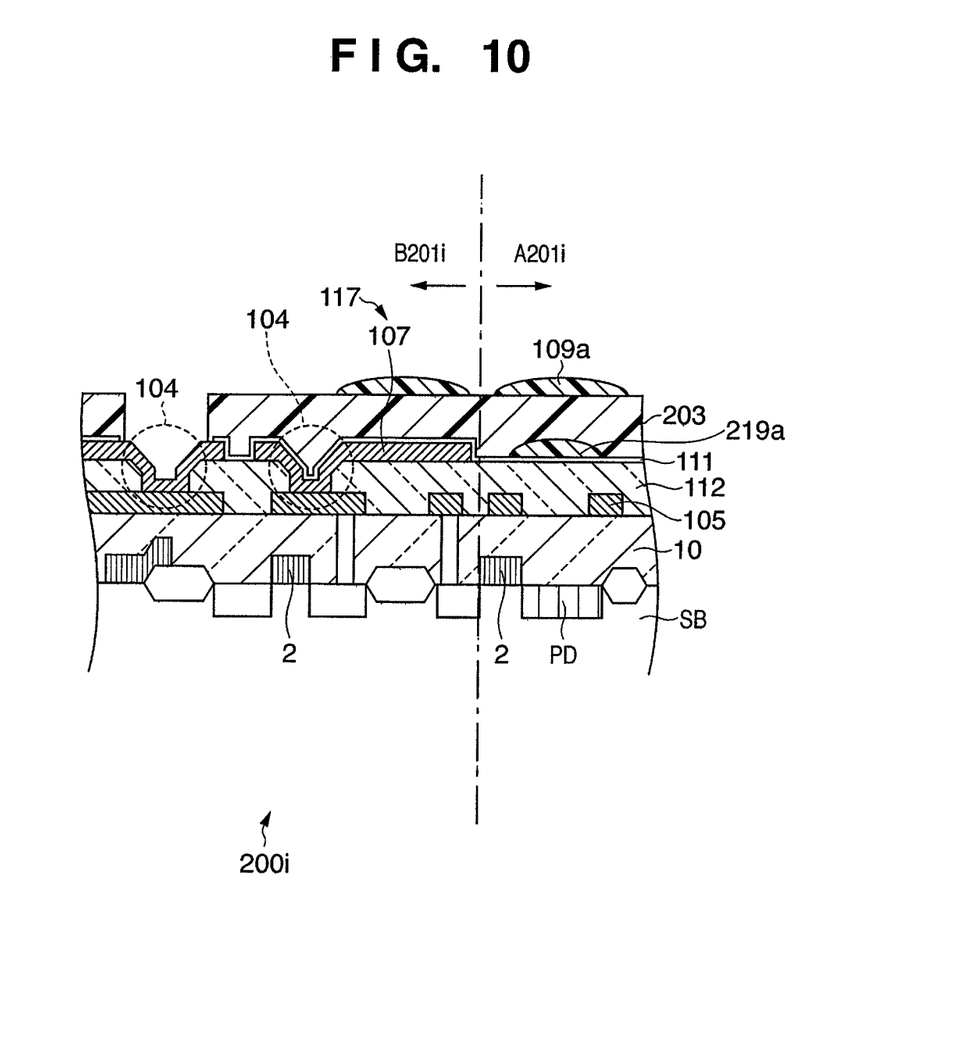
FIG. 10 is a sectional view of a photoelectric conversion device according to a modification to the second embodiment of the present invention.

In a photoelectric conversion device 2001 shown in FIG. 10, no color filter 108a (see FIG. 1) need always be arranged in a pixel area A201i. Even in this case, a color image can be attained by performing a process to convert the gray level of a monochrome image into that of a color image using an image signal processor 97 (see FIG. 8) or the like.

Figure 11:
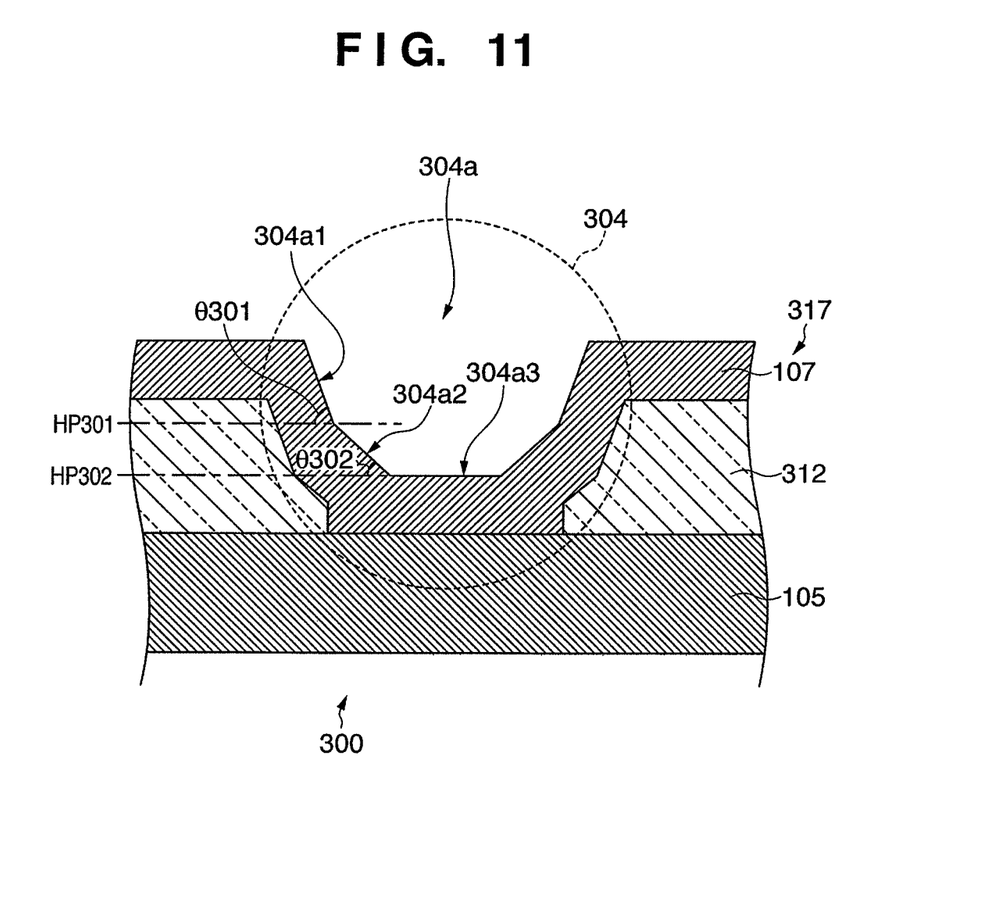
FIG. 11 is an enlarged sectional view of the vicinity of the second pattern in a photoelectric conversion device according to the third embodiment of the present invention.

A photoelectric conversion device according to the third embodiment of the present invention will be described next with reference to FIG. 11. FIG. 11 is an enlarged sectional view of the vicinity of the second pattern in the photoelectric conversion device according to the third embodiment of the present invention. In the third embodiment, mainly points that differ from the first embodiment will be described, and a description of the same parts will be omitted.

A photoelectric conversion device 300 has the same basic arrangement as that in the first embodiment, but is different from that in the first embodiment in the shape of the opening of an interlayer insulation film 312 and that of a second pattern 304 of a metal layer 317. More specifically, in a recess 304a of the second pattern 304, a taper angle $\theta 301$ (an angle made with a horizontal plane HP301) of a first side face 304a1 is larger than a taper angle $\theta 302$ (an angle made with a horizontal plane HP302) of a second side face 304a2. In the opening of the interlayer insulation film 312, the taper angle ($\approx \theta 301$) of the first side face of opening corresponds to the taper angle $\theta 301$ of the first side face 304a1. The taper angle ($\approx \theta 302$) of the second side face of opening corresponds to the taper angle $\theta 302$ of the second side face 304a2. This is the same as the first embodiment.

Even in this case, the first side face 304a1 is downwardly tapered toward the bottom face of the recess 304a. The shape (tapered shape) suitable for forming the second pattern 304 with good coatability can ensure a good electrical connection between a metal layer 105, a first pattern 107, and the second pattern 304.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-236762, filed Aug. 31, 2006, which is hereby incorporated by reference herein in its entirety.

What is claimed is:

1. A photoelectric conversion device comprising:
   a semiconductor substrate that includes a first region receiving light and containing a plurality of photoelectric converters and a second region that is shielded from light;
   a multilayer wiring structure arranged on the semiconductor substrate and including a first wiring layer, an interlayer insulation film arranged to cover the first wiring layer, and a second wiring layer arranged on the interlayer insulation film, wherein the second wiring layer is thinner than the first wiring layer;
   a passivation film arranged to cover the second wiring layer and the interlayer insulation film;
   an interlayer lens arranged on the passivation film in the first region in which the second wiring layer is not arranged, with the interlayer lens being arranged at a level where the second wiring layer is arranged, and no interlayer lens being arranged in the second region in which the second wiring layer is arranged, and with a top face of the interlayer lens and a top face of the passivation film in the second region being almost the same height level; and
   a planarized layer arranged to cover the second wiring layer and the interlayer lens.

2. A photoelectric conversion device comprising:
   a pixel area where light enters a photoelectric converter;
   a peripheral circuit area,
   wherein a top wiring layer in the peripheral circuit area is arranged at a level higher than a top wiring layer in the pixel area, the top wiring layer in the peripheral circuit area being thinner than the top wiring layer in the pixel area, an interlayer insulation film arranged to cover the top wiring layer in the pixel area and a wiring layer in the peripheral circuit area, with the wiring layer in the peripheral circuit area arranged at the same level as the top wiring layer in the pixel area, and the top wiring layer in the peripheral circuit area arranged on the interlayer insulation film, a passivation film arranged to cover the top wiring layer in the peripheral circuit area and the interlayer insulation film;

wherein an interlayer lens is arranged on the passivation film in the pixel area and no interlayer lens is arranged in the peripheral circuit area, the interlayer lens being arranged at a level where the top wiring layer in the peripheral circuit area is arranged, and a top face of the interlayer lens and a top face of the passivation film in the peripheral circuit area being almost the same height level, and a planarized layer arranged to cover the top wiring layer in the peripheral circuit area and the interlayer lens.

3. The photoelectric conversion device according to claim 2, wherein the top wiring layer in the peripheral circuit area includes:

a first pattern arranged on a top face of the interlayer insulation film, and a second pattern that is arranged in an opening of the interlayer insulation film so as to connect the first pattern to the wiring layer in the peripheral circuit area, which is arranged at the same level as the top wiring layer in the pixel area, wherein the opening includes a tapered shape to decrease an opening width from the first pattern toward the wiring layer, which is arranged at the same level as the top wiring layer in the pixel area, and the second pattern has a tapered upper surface that is created due to the tapered shape of the opening.

4. The photoelectric conversion device according to claim 3, wherein the opening includes at least:

a first area extending from a lower face of the first pattern, and a second area extending from the first area to the wiring layer, which is arranged at the same level as the top wiring layer in the pixel area, and a taper angle of the first area is smaller than a taper angle of the second area.

5. The photoelectric conversion device according to claim 3, wherein the opening includes at least:

a first area extending from a lower face of the first pattern, and a second area extending from the first area to the wiring layer, which is arranged at the same level as the top wiring layer in the pixel area, and a taper angle of the first area is larger than a taper angle of the second area.

6. . The device according to claim 1, wherein a microlens is arranged on the planarized layer to collect light on the photoelectric converter.

7. The photoelectric conversion device according to claim 2, wherein the peripheral circuit area includes an optical black area.

8. The photoelectric conversion device according to claim 1, wherein the photoelectric conversion device is incorporated in an image sensing system that includes:

an optical system, which forms an optical image of an object on the photoelectric conversion device; and a signal processing unit, which processes a signal output from the photoelectric conversion device to generate image data.

9. The photoelectric conversion device according to claim 2, wherein the planarized layer is formed from a resin, and the interlayer lens is formed from a substance having a refractive index different from a refractive index of the planarized layer.

10. A photoelectric conversion device comprising:

a pixel area where light enters a photoelectric converter; and a peripheral circuit area, wherein a top wiring layer in the peripheral circuit area is arranged at a level higher than a level of a top wiring layer in the pixel area, with an interlayer insulation film arranged to cover the top wiring layer in the pixel area and a wiring layer in the peripheral circuit area, with the wiring layer in the peripheral circuit area arranged at the same level as the top wiring layer in the pixel area, the top wiring layer in the peripheral circuit area being arranged on the interlayer insulation film, wherein a passivation film is arranged to cover the top wiring layer in the peripheral circuit area and the interlayer insulation film, and wherein an interlayer lens is arranged in the pixel area, and a top face of the interlayer lens and a top face of the passivation film in the peripheral circuit area are almost the same height level.

11. A photoelectric conversion device having a pixel area and a peripheral circuit area including an optical black area, the device comprising:

a semiconductor substrate that includes a plurality of photoelectric converters;

a multilayer wiring structure arranged above the semiconductor substrate such that a number of wiring layers in the pixel area is different from a number of wiring layers in the peripheral circuit area;

a first planarized layer arranged on the multilayer wiring structure in the pixel area and the peripheral circuit area;

a plurality of color filters arranged on the first planarized layer in the pixel area and the peripheral circuit area;

a second planarized layer arranged to cover the first planarized layer and the plurality of color filters in the pixel area and the peripheral circuit area; and a plurality of micro lenses arranged on the second planarized layer in the pixel area and the peripheral circuit area, wherein the multilayer wiring structure includes:

a first wiring layer arranged in the pixel area and the peripheral circuit area, an interlayer insulation film arranged to cover the first wiring layer in the pixel area and the peripheral circuit area, the interlayer insulation film having a planarized top face in the pixel area and the peripheral circuit area, a second wiring layer arranged on the interlayer insulation film in the peripheral circuit area so as to shield the semiconductor substrate in the peripheral circuit area, the second wiring layer not being arranged on the interlayer insulation film in the pixel area, a passivation film arranged to cover the second wiring layer and the interlayer insulation film;

an interlayer lens arranged on the passivation film in the pixel area in which the second wiring layer is not arranged, and no interlayer lens arranged in the peripheral circuit area in which the second wiring layer is arranged, wherein the first planarized layer is arranged to cover the passivation film and the inter layer lens, and a top face of the interlayer lens and a top face of the passivation film in the peripheral circuit area in which the second wiring layer is arranged being almost the same height level, wherein the second wiring layer is thinner than the first wiring layer, and wherein the second wiring layer includes:

a first pattern arranged on the interlayer insulation film, and a second pattern, which connects the first pattern to the first wiring layer, the second pattern being arranged in an opening of the interlayer insulation film, and the opening including a tapered shape to decrease an opening width from the first pattern toward the first wiring layer, the second pattern having a tapered upper surface that is created due to the tapered shape of the opening.

12. The photoelectric conversion device according to claim 2, wherein the passivation film includes a first portion covering the top wiring layer in the peripheral circuit area, a second portion extending under the interlayer lens, and a third portion connecting the first portion and the second portion.

13. The photoelectric conversion device according to claim 10, wherein the passivation film includes a first portion covering the top wiring layer in the peripheral circuit area, a second portion extending under the interlayer lens, and a third portion connecting the first portion and the second portion.

14. The photoelectric conversion device according to claim 1, wherein the first region is a pixel area region.

15. The photoelectric conversion device according to claim 1, wherein the second region is a peripheral circuit area region.

* * * * *